350-370 SR
XR 3,491,241
Jan. 20, 1970 K. LEHOVEC 3,491,241
MODULATION OF CURRENT FLOW IN A SEMICONDUCTOR
Filed Feb. 19, 1968
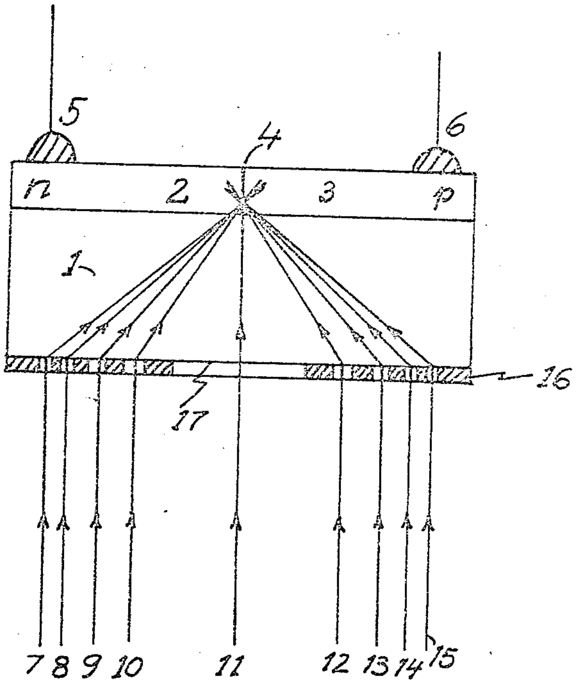

United States Patent Office 3,491,241

Patented Jan. 20, 1970

3,491,241

MODULATION OF CURRENT FLOW IN A SEMICONDUCTOR

Kurt Lehovec, Williamstown, Mass., assignor to Inventors and Investors, Inc., Williamstown, Mass., a corporation of Massachusetts Filed Feb. 19, 1968, Ser. No. 706,529
Int. Cl. H01j *39/12;* G02f *1/18*
U.S. Cl. 250—211 4 Claims

ABSTRACT OF THE DISCLOSURE

Current flow in a portion of a semiconducting body is modulated by the electric field of an electromagnetic wave focussed on that portion. In particular, current flow across the p-n junction of a tunnel diode or an avalanche diode is modified by an electromagnetic wave passing along the junction plane and linearly polarized so that the electric field vector is perpendicular to the junction.

Background of the invention

Semiconducting components and devices utilize the motion of carriers of electricity, electrons or holes, in electric fields which are generated by charges. An electric signal arises either by modifying the fields by means of the charges generating them or else by creating additional carriers of electricity in the existing fields. An example for the first mentioned case is the application of a potential at a p-n junction; an example for the second mentioned case is the generation of electron-hole pairs in a p-n junction by absorption of photons of sufficient energy.

The modulation of electric fields by applied potentials becomes often ineffective at frequencies above $10^9$ Hz. due to shunt capacitances, inductances, etc. The generation of signals by means of creation of electron-hole pairs by photon absorption encounters difficulties at wavelengths larger than 10 microns, since the photon induced generation of electron-hole pairs has to compete with thermal generating of electron-hole pairs at room temperature operation. These and other difficulties are overcome by the present invention.

It is an objection of this invention to describe a means of generating electric signals in semiconductors by electromagnetic waves, which means does not involve field generation by charges or creation of carriers of electricity by photon absorption.

It is another objection of this invention to provide an infrared and microwave sensing device essentially free of interference from thermal generation of electron-hole pairs by using a wide band semiconductor.

It is another objection of the invention to modify an electromagnetic wave field by superposition of the electromagnetic wave emitted from electric charges moving across a large field region of a semiconducting body under the influence of the electromagnetic wave field to be modified.

Summary of the invention

An electromagnetic wave is concentrated on a portion of a semiconducting body to create there a large electric field. This field in conjunction with already existing fields due to electric charges modifies the charge carrier flow in that portion of the semiconducting body. This arrangement is particularly effective in structures where current flow depends strongly on the electric field intensity, viz., p-n junction currents of the tunnel mode or else avalanche mode. The electromagnetic wave is passed along such a junction and is polarized so that the electric field vector is directed perpendicular to the junction.

It is emphasized that the interaction between the electromagnetic wave and the semiconductor utilized in this patent does not involve absorption of photons. The effect of the electromagnetic wave on the semiconductor current is similar to that of a grid voltage in a vacuum tube, i.e., there is no significant power loss of the electromagnetic wave. However, the electrons crossing the junction under the influence of the incident electromagnetic wave together with the holes left behind represent an electric dipole oscillating with the frequency of the electromagnetic wave and the radiation of this dipole is superimposed over the electromagnetic wave.

Brief description of the drawing

The figure shows a structure according to this invention for transferring an incoming electromagnetic wave into an electric signal.

Description of the preferred embodiment

In the figure, the semiconducting body 1 is provided with a heavily doped $n^+$-region 2 and a heavily doped $p^+$-region 3 forming a p-n junction 4. Contacts 5 and 6 to the n- and p-regions, respectively, are shown for utilizing this junction as a tunnel diode. An incident electromagnetic wave is indicated by the rays 7–15, and is focussed on the junction 4 by means of the zone plate lens 16 located on the surface 17 of the semiconducting body 1. The zone plate consists of a set of opaque concentric rings of radii appropriate for the wavelength of the incident radiation, and of the distance from the surface 17 to the junction 4 and of the index of refraction of the semiconductor 1. The semiconducting body is made from a material which is transparent to the rays 7–15.

The electromagnetic wave is polarized so that its electric field vector is parallel to the plane of drawing, i.e., it is perpendicular to the junction 4.

The electric field of the electromagnetic wave increases the p-n junction field in one half-cycle and opposes it in the other. Accordingly, the tunnel current through the junction is increased during one half-cycle and decreased during the other half-cycle. Thus, the tunnel current is modulated in accordance with the electromagnetic wave. Since the dependence of the tunnel current on the electric field is strongly non-linear, the average current through the junction is affected by the electromagnetic wave.

For a quantitative analysis of the effect, consider the following: Tunneling consists of the transition of an electron from the filled or valence band into the conduction band. Band refers to a certain group of energy levels for electrons in the semiconductors. Electrons of the energy values corresponding to the levels of the valence or conduction band can propagate through the crystal. Between the energy levels of the valence and conduction bands lies a group of energy levels called the forbidden band. The energy range of this group is called the forbidden bandgap B and can be expressed conveniently in electron volts. Germanium has a forbidden bandgap of about 0.8 ev. and silicon of 1.1 ev. Applications of an electric field E tilts the energy bands by the amount of $qE$ when $q$ is the electron charge. This enables electrons to cross from the valence band to the conduction band without gain or loss of energy by tunneling through the forbidden band at a constant energy, thus generating an electron-hole pair. The distance the tunneling electron has to travel through a forbidden band of width B in the field E is $L=B/qE$. Since electrons cannot propagate readily on energy levels in the forbidden band, the probability for crossing the forbidden band becomes rapidly smaller with increasing L, i.e., decreasing field. In fact, the probability for tunneling decreases by about a factor of 10 for a distance increment of a few angstrom-units only.

A typical tunnel distance in a p-n junction is of the order of perhaps 30 angstrom-units.

The tunnel current is significantly modified by a change of the tunnel distance L of about one angstrom-unit. Since changes of L are related to changes of E by $\Delta L/L = -\Delta E/E$, we require a change of E by 1% for a change of L by 1%. In case $B \simeq 1$ ev., $L \simeq 30$ A., $E \simeq 3 \times 10^6$ volts/cm., we require an electromagnetic wave having an electric field intensity of at least $3 \times 10^4$ volts/cm. This corresponds to an energy flux in the electromagnetic wave of $\epsilon\epsilon_0 E^2 C \simeq 30$ megawatts/cm.$^2$, when a dielectric contact of $\epsilon = 10$ has been assumed; $c = +3.10^{10}$ cm./sec. is the light velocity and $\epsilon_0 \simeq 10^{-13}$ ampsec./volt cm.

Intensities of this order of magnitude and much larger ones are readily available in pulsed laser beams. Laser beams are also very suitable for the field modulation according to this invention because of their monochromaticity and coherence which makes them very suitable for Fresnel optical focusing, e.g., focusing of a zone plate as shown in the figure.

Obviously the modulation of the junction tunnel current depends on the polarization of the electromagnetic wave with respect to the junction plane. Thus the device of the figure can be used for analysis of the plane of polarization of an incoming electromagnetic wave.

Next we shall discuss the generation of electron-hole pairs by an electromagnetic wave by the so-called avalanche process. This mode of operation can be achieved in a structure quite similar to that shown in the figure. The main difference consists in the degree of doping of the p- and n-regions. Unlike the case of the figure, these regions should be lightly doped, e.g., about $10^{14}$–$10^{16}$ impurities per cm.$^3$ in the case of silicon. The p-n junction 4 is biased in the blocking direction by means of potentials applied to 5 and 6, in such a manner that conditions close to avalanche breakdown exist in the junction 4. The added electric field of the electromagnetic wave represented by the rays 7–15 initiates avalanche breakdown. A crude estimate of the electric field required is as follows. Let the wavelength of the radiation be $\lambda$. The frequency of the radiation is thus $\nu = c/\lambda$ and the duration of a half-cycle becomes $\tau = (2\nu)^{-1} = \lambda/2c$. For a wavelength of 100 microns, one has $\tau \simeq 1.7 \times 10^{-13}$ sec.

A free electron initially at rest travels a distance $s = (qE/2m)\tau^2$ during the time $\tau$ in an electric field E, where $m$ is the electron mass. The energy gained over this distance is $qsE = (q^2E^2/2m)\tau^2$. In order to obtain an avalanche effect, this energy must be sufficient to generate electron-hole pairs, i.e., it must be larger than the forbidden bandwidth B. In the case that $B \simeq 1$ ev. and for $\tau = 1.7 \times 10^{-13}$ sec., one requires a field of $2 \times 10^5$ v./cm.

While the invention has been illustrated on hand of p-n junction diodes, it should be understood that it is not limited to these devices, but encompasses all structures covered by the following claims.

I claim:

1. A device to convert polarized electromagnetic radiation having an electric field vector into electric current, said device consisting of a semiconducting body transparent to said radiation, a high field region comprising a junction in said semiconducting body, electrodes applied at said semiconducting body passing a current through said high field region, means to focus said electromagnetic radiation on said high field region in such a manner that the electric field vector of said polarized electromagnetic radiation is perpendicular to the junction and modulates the field in said high field region, thereby affecting the electric current through said high field region.

2. The device described in claim 1 whereby the electromagnetic radiation is monochromatic and coherent, and the means to focus said radiation on the high field region is a Fresnel optical system located at a surface of said semiconducting body.

3. The device described in claim 1, said high field region being the junction of a tunnel diode.

4. The device described in claim 1, said high field region being the p-n junction of an avalanche diode.

References Cited

UNITED STATES PATENTS

| | | | |
|---|---|---|---|
| 2,816,283 | 12/1957 | Steele | 250—211 X |
| 3,262,122 | 7/1966 | Fleisher et al. | 350—162 X |
| 3,328,723 | 6/1967 | Giordmaine et al. | 317—235 X |
| 3,403,262 | 9/1968 | Seidel | 250—225 X |

WALTER STOLWEIN, Primary Examiner

U.S. Cl. X.R.

210—225; 317—235